(12) United States Patent
Ruckerbauer et al.

(10) Patent No.: US 7,414,917 B2
(45) Date of Patent: Aug. 19, 2008

(54) RE-DRIVING CAWD AND RD SIGNAL LINES

(75) Inventors: Hermann Ruckerbauer, Moos (DE); Simon Muff, Mering (DE); Christian Weiss, München (DE); Peter Gregorius, München (DE)

(73) Assignee: Infineon Technologies, Neubiberg (DE)

( * ) Notice: Subject to any disclaimer, the term of this patent is extended or adjusted under 35 U.S.C. 154(b) by 106 days.

(21) Appl. No.: 11/192,335

(22) Filed: Jul. 29, 2005

(65) Prior Publication Data

US 2007/0025131 A1 Feb. 1, 2007

(51) Int. Cl.
*G11C 8/00* (2006.01)
(52) U.S. Cl. ............... 365/233.13; 365/51; 365/189.05; 365/191
(58) Field of Classification Search ............... 365/63, 365/191, 230.06, 51, 189.05, 198, 230.03, 365/189.17, 233.13
See application file for complete search history.

(56) References Cited

U.S. PATENT DOCUMENTS

| | | | | | |
|---|---|---|---|---|---|
| 5,157,635 | A  * | 10/1992 | Ellis et al. | ............... | 365/230.06 |
| 6,125,419 | A  * | 9/2000 | Umemura et al. | ........... | 710/110 |
| 6,477,614 | B1 * | 11/2002 | Leddige et al. | ................ | 711/5 |
| 6,847,617 | B2 * | 1/2005 | Borkar et al. | ................ | 370/258 |
| 7,130,958 | B2 * | 10/2006 | Chou et al. | ................. | 711/103 |
| 7,133,962 | B2 * | 11/2006 | Leddige et al. | ............. | 711/105 |
| 7,200,693 | B2 * | 4/2007 | Jeddeloh | ....................... | 710/22 |
| 2002/0023191 | A1 * | 2/2002 | Fudeyasu | ..................... | 711/104 |
| 2004/0151038 | A1 * | 8/2004 | Ruckerbauer et al. | ....... | 365/200 |
| 2004/0225853 | A1 | 11/2004 | Lee et al. | | |
| 2005/0142950 | A1 | 6/2005 | Haba et al. | | |
| 2006/0262632 | A1 * | 11/2006 | Osborne | ................ | 365/230.05 |
| 2006/0265543 | A1 * | 11/2006 | Oeschay et al. | ................ | 711/5 |
| 2006/0285424 | A1 * | 12/2006 | Gregorius et al. | ........... | 365/233 |
| 2006/0291263 | A1 * | 12/2006 | Wallner et al. | ................ | 365/63 |
| 2007/0005831 | A1 * | 1/2007 | Gregorius | ..................... | 710/52 |

* cited by examiner

*Primary Examiner*—Richard T. Elms
*Assistant Examiner*—Alexander G Sofocleous
(74) *Attorney, Agent, or Firm*—Edell, Shapiro & Finnan, LLC

(57) ABSTRACT

Semiconductor memory modules and semiconductor memory systems using the same are described herein. The modules divide a conventional DIMM into a series of separate, smaller memory modules. Each memory module includes at least one semiconductor memory chip arranged on a substrate; CAwD signal input lines arranged on the substrate in a first predetermined line number and connecting one of the semiconductor memory chips to CAwD input signal pins on the substrate; and rD signal output lines arranged on the substrate in a second predetermined line number and connecting the one or a last semiconductor memory to a second number of rD output signal pins of the substrate. In a semiconductor memory system including the semiconductor memory modules, each memory module is separately connected to a memory controller by the CAwD signal input lines and the rD signal output lines in a respective point-to-point fashion.

9 Claims, 4 Drawing Sheets

RE-DRIVING CAWD AND RD SIGNAL LINES

FIELD OF THE INVENTION

The present invention relates to semiconductor memory modules and a memory system using the same.

BACKGROUND

A dual inline memory module (DIMM) includes a specified number of memory chips and I/O lanes scaling with an X86 processor memory interface. Currently, the bus width for DDR1, DDR2, DDR3, and SDR is 64 bits. To supply the required 64 bit bus, typical DIMMs for desktop PCs are 8×8 memory chips.

FIG. 4 shows a prior art dual inline memory module (DIMM) comprising 8×8 memory chips M1-M8. The first seven memory chips M1-M7 may be used for data storage and the last memory chip M8 may be used for ECC bit storage. This conventional DIMM is required to have a 72 bit bus width of the DQ bus which includes write data wD, read data rD, and ECC bit signals from/to a memory controller MC. For example, DDR3-DRAM on a conventional DIMM have a single bidirectional bus for rD and wD. The CA bus transmitting command and address signals CA from the memory controller MC to the DIMM comprises (in this example) 20 lines. Since a normal connector C of the DIMM has a maximum pin count of 240, a differential signalling which a 72×2=144 bit DQ bus 120×2=240 CA bus cannot be realized with the conventional DIMM. One problem for the pin count is that you need a ratio of 2:1:1 signal to power to ground, so one needs to double the pin count compared to just counting the signal pins.

Increasingly, applications are requiring different bus width. Normal servers use 72 bit wide busses to get additional 8 bits for error correction codes (ECC). In addition, high end servers need to combine 2/4 channels to get a 144/288 bit wide data bus to implement more sophisticated error correction algorithms (for example, a chip kill to repair a complete single chip failure). Furthermore, game consoles, mobile applications, network applications, graphic applications and set top boxes can, for example, utilize smaller bus width as they do not need so much memory capacity.

Since high end servers need to combine 2/4 channels to get a 144/288 bit wide data bus to be able to implement a more sophisticated error connection algorithm (e.g. a chip kill to repair a complete single bit failure), there arises the problem that the processor (processor cache) needs a specific amount of memory per need access and that a combination of several channels gives back more data bits per read command that the processor cannot utilize.

Furthermore, modern memory systems increasingly include memory chips (DRAMs) with a single CA bus that is 20 bit wide, so it is difficult to change the bus width for the DIMM. Consequently, the standard 64 bit approach is not practical for different applications, lacking adaptability. In addition, data, command, and address signals of future memory generations will be transmitted as differential signal pairs. This has the disadvantage of necessitating double pin count, (i.e., 128 pins for a 64 bit bus). This is not possible with present DIMMs. Changing to a 32 bit bus with double speed would hold the DQ pin count constant, but the command and address signals cannot be supplied fast enough to all chips in the conventional method. This means that also the command and address signals require a point-to-point signal connection, which adds pin count at the connector of the DIMM for additional DRAM chips. In view of the above, use of a conventional DIMM having a 240 pin connector for providing, e.g., four data lanes plus 1 ECC lane will be difficult to realize. Consequently, it would be desirable to decrease the pin number of a memory module while increasing the flexibility of its use in spite of differential signal supply.

OBJECTS AND SUMMARY

Accordingly, it is an object of the present invention to provide a semiconductor memory module as well as a memory system in which differential signal transmission is possible and at the same time the pin count of the memory module can be reduced and the flexibility of usage can be increased.

It is a further object of the current invention to provide a flexible semiconductor memory module that can be easily configured for various applications.

The aforementioned objects may be achieved individually and/or in combination, and it is not intended that the present invention be construed as requiring two or more of the objects to be combined unless expressly required by the claims attached hereto.

According to the present invention, a semiconductor memory module may comprise a plurality of semiconductor memory chips arranged on a substrate in a specified topology; CAwD signal input lines arranged on the substrate in a first predetermined line number and connecting a first one of the memory chips to a first number of CAwD input signal pins on the substrate, with the first number being equal to the first predetermined line number for supplying write data command and address input signals from an external memory controller to the first memory chip in a first direction; CAwD signal interconnection lines arranged on the substrate and establishing re-driven write data, command, and address signal interconnections between the plurality of memory chips for supplying re-driven write data, command, and address signals from each preceding memory chip to each succeeding memory chip in the first direction; rD signal output lines arranged on the substrate in a second predetermined line number and connecting the second or a last one of the plurality of memory chips different from the first memory chip to a second number of rD output signal pins on the substrate, the second number being equal to the predetermined second line number for delivering read data output signals generated or re-driven by one or more of the plurality of memory chips to the memory controller; and rD signal interconnection lines arranged on the substrate that establish re-driven read data interconnections between the plurality of memory chips for supplying generated/re-driven read data signals from preceding to succeeding memory chips in the first direction.

The first direction is basically valid only on the memory module. For write from the memory controller to the memory chips and for read from the memory chips to the memory controller, the direction needs to be different. In one embodiment, the memory chips and the signal lines are arranged and connected in a loop-forward architecture, wherein the first and further memory chips except the last memory chip have a re-drive function for the write data, command, and address signals, and the second and further memory chips (i.e., not the first memory chip) have a re-drive function for the read data signals.

In another embodiment, the semiconductor memory module may include two memory chips (one first and one second memory chip), as well as CAwD signal interconnection lines and rD signal interconnection lines that respectively establish interconnection between the first and second memory chips in the first direction for supplying re-driven write data, command, and address signals and read data signals from the first to the second memory chip. Preferably, the first predetermined line width is 8 and a second predetermined line width is 8.

According to another embodiment of the invention, the semiconductor memory module the CAwD signal input lines, the CAwD signal interconnection lines, the rD signal output lines, and the rD signal interconnection lines each comprises a differential signal line pair each for transmitting a differential signal. In a preferred embodiment of the present semiconductor memory module, the semiconductor memory chip are DDR-DRAM chips.

The present invention may further comprise a memory controller and a plurality of semiconductor memory modules separately connected to the memory controller in a point-to-point fashion by the CAwD signal input lines and the rD signal output lines, respectively.

The present invention may also include a memory controller and a plurality of semiconductor memory modules separately connected to the memory controller in a point-to-point fashion by the CAwD signal input lines and the rD signal output lines.

The above and still further objects are achieved by splitting up a conventional DIMM (having 240 pins) into a number of smaller semiconductor memory modules (for example 60 pins each) and going to a point-to-point connection for supplying write data, command, and address signals to the memory chips on the semiconductor memory module, thereby creating separate lanes per memory chip. This solution permits flexible usage of the independent semiconductor memory modules with small bus widths: game consoles could use just two of this small memory modules utilizing, for example, a 16 bit bus, and servers could configure their requirements on a per need base. ECC, Single Error Correction (SEC), or Double Error Detection (DED) can be achieved by four data memory modules plus one ECC memory module, each module comprising two semiconductor memory chips. More complex SEC or DED algorithms can be implemented by using four data memory modules plus two ECC memory modules. Such a splitting of the memory modules is not currently possible with the conventional concept of supply command and address data.

Thus, due to the splitting into a number of smaller memory modules, the flexibility of usage for different applications can be markedly increased and the granularity of the memories better adapted to different applications. The smaller pin number of the smaller semiconductor memory module according to the invention allows a differential signal transmission from the memory controller to the memory module.

The above and further objects, features and advantages of the present invention will become apparent upon consideration of the following detailed description of specific embodiments thereof, particularly when taken in conjunction with the accompanying drawings, wherein like reference numerals in the various figures are utilized to designate like components.

DETAILED DESCRIPTION

Figure 4:
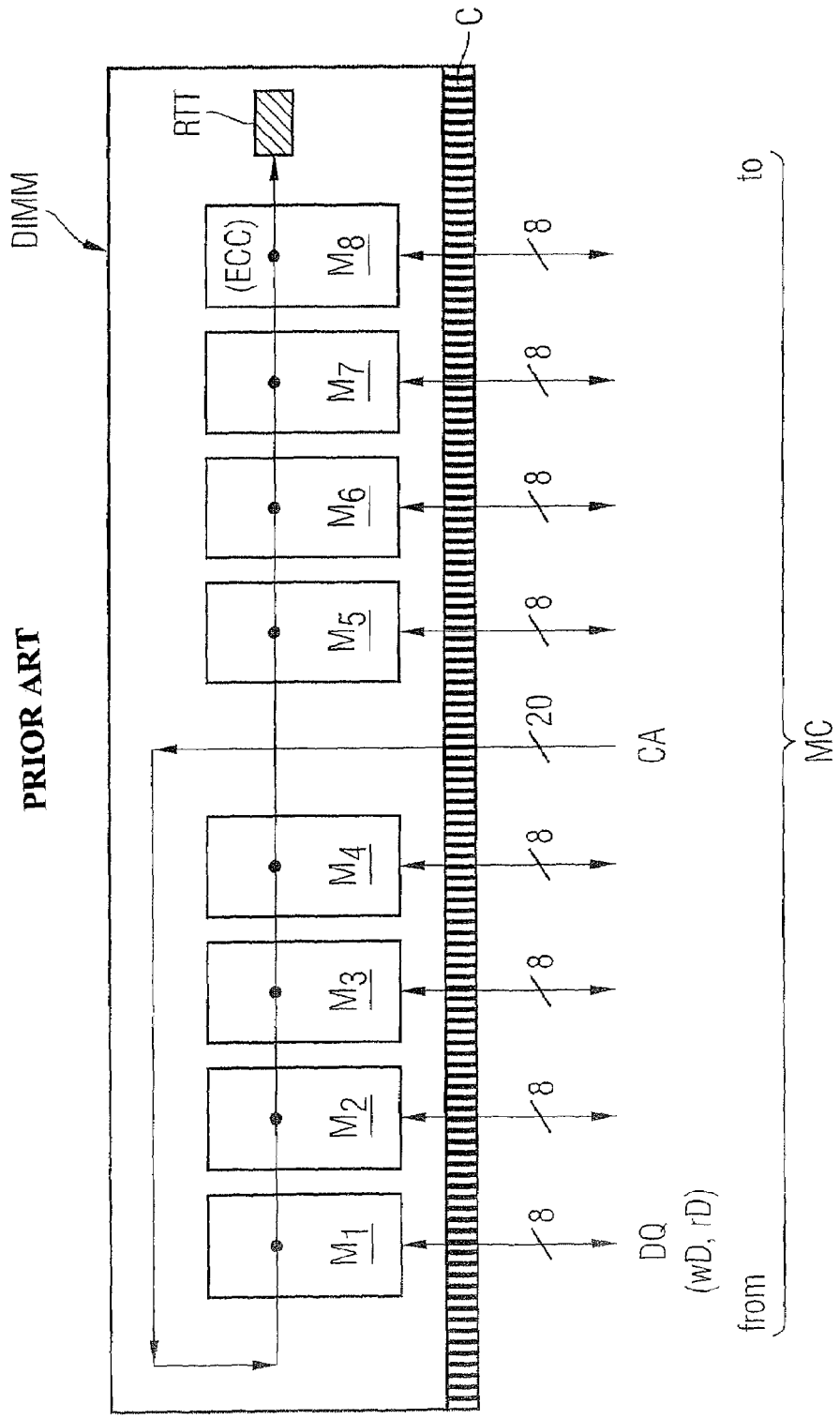
FIG. 4 illustrates a schematic diagram showing a conventional, prior art DIMM memory module.

In view of the above, the present invention divides the conventional 240 pin DIMM (FIG. 4) into a number of smaller memory modules having a portion of the total pin number (e.g., four modules with 60 pins each) to provide more flexible usage of the independent smaller memory modules.

Figure 1:
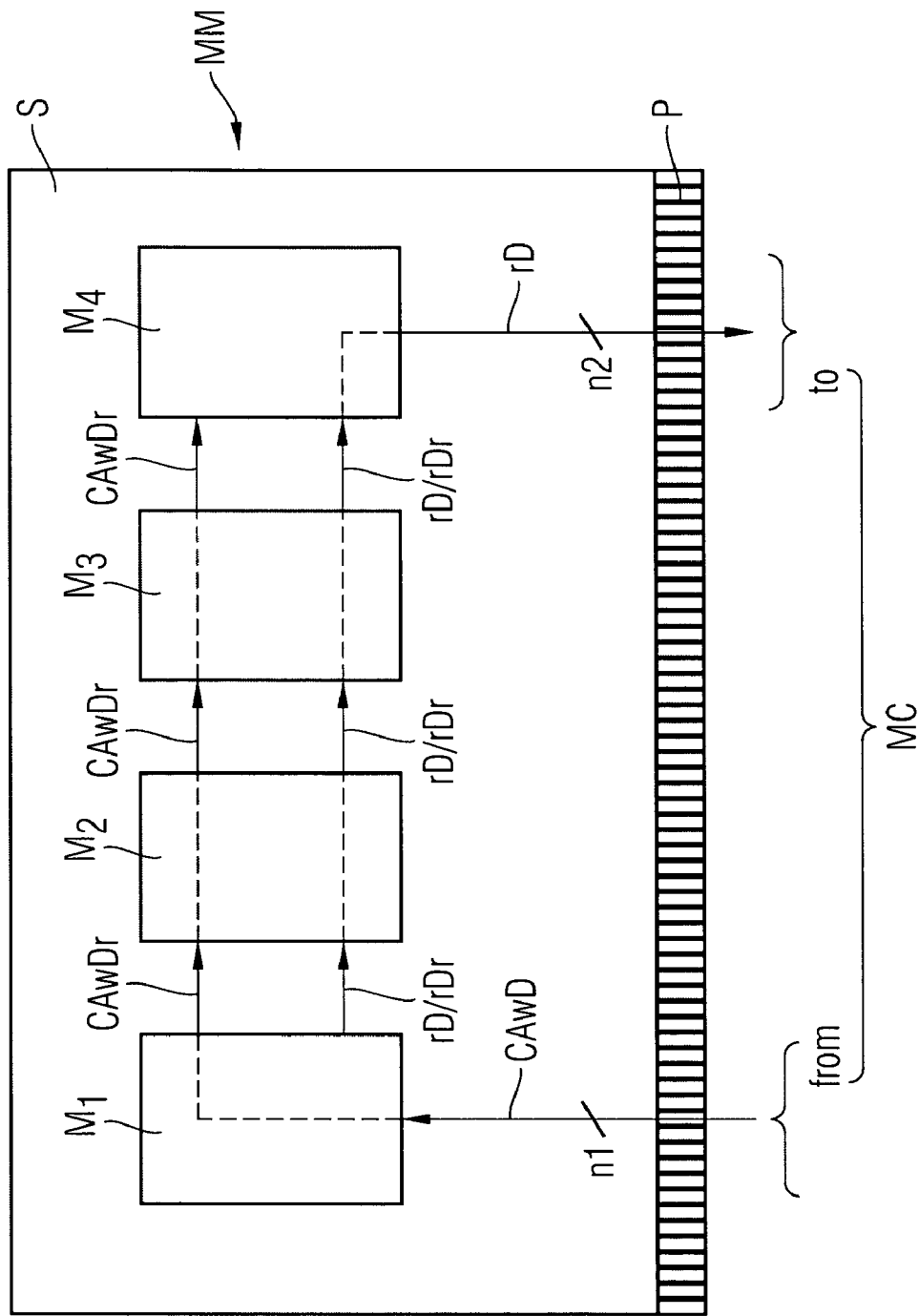
FIG. 1 illustrates a schematic diagram of a semiconductor memory module according to an embodiment of the invention, showing four semiconductor memory chips.

FIG. 1 shows a block diagram of a the semiconductor memory module in accordance with an embodiment of the present invention. As shown in FIG. 1, a semiconductor memory module MM comprises a plurality of four semiconductor memory chips M1, M2, M3, M4 arranged on a substrate S in a specific order (in this example, the chips are arranged in a loop forward architecture). The semiconductor memory chips may include, but are not limited to DDR-DRAM chips. The substrate S includes connector pins P and CAwD signal input lines CAwD supplying write data, the second line number (and thus the pin number) of the rD signal output lines rD, as well as the line number of the rD signal interconnection lines differ from that described above for the first embodiment depicted in FIG. 1.

Figure 2:
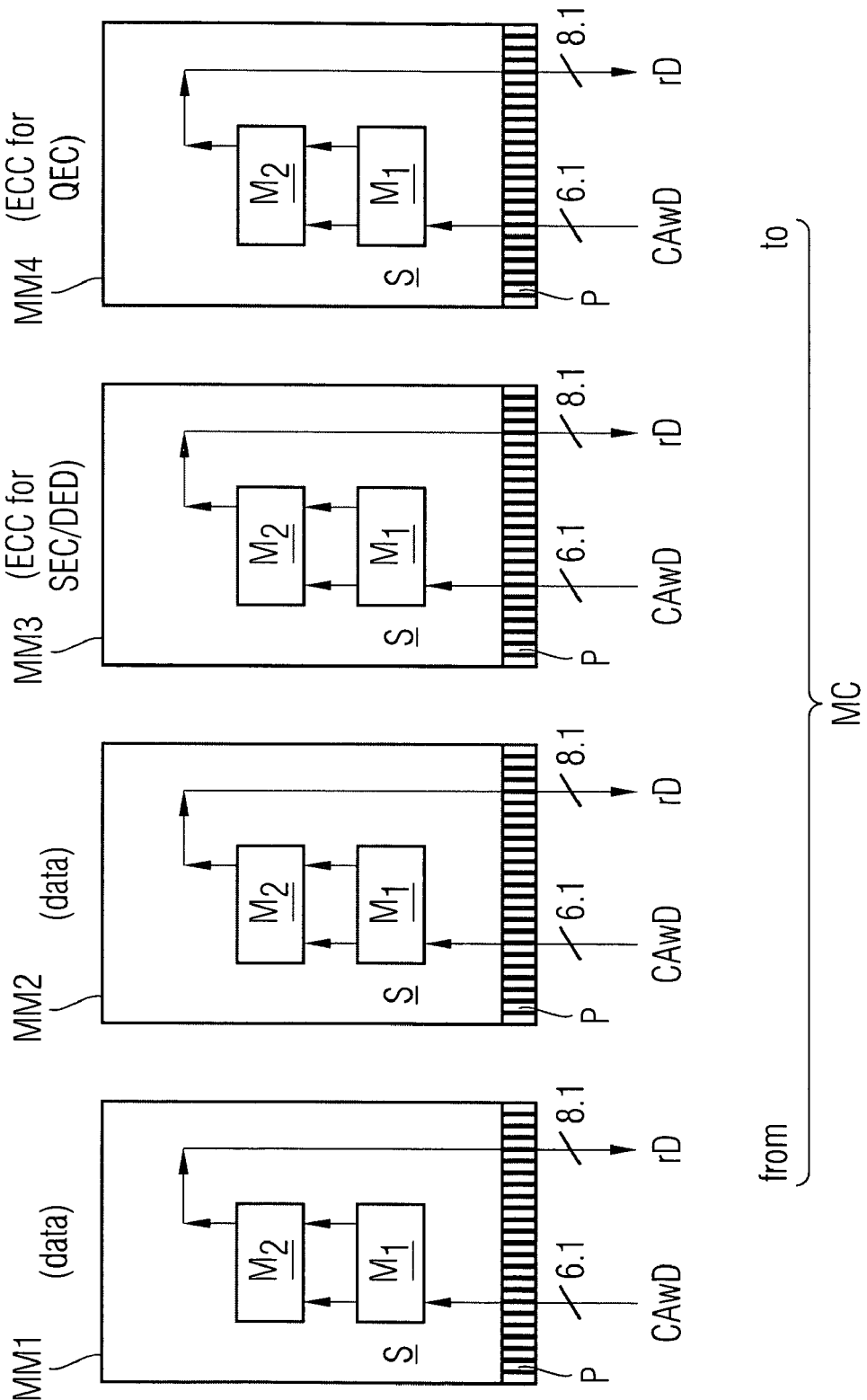
FIG. 2 illustrates a schematic diagram of a semiconductor memory module according to another embodiment of the invention, showing four memory modules each having two semiconductor memory chips.

A memory system using the semiconductor modules MM1 to MM4 according to FIG. 2 may include separate memory modules MM1 to MM4 that are separately connected to the memory controller MC by the CAwD signal input lines and by the rD signal output lines in a respective point-to-point fashion and, therefore, includes separate lanes per memory chip. Each of the CAwD signal input lines, the CAwD signal interconnection lines, the rD signal output lines, and the rD signal interconnection lines, then, may comprise a differential signal line pair adapted to transmit a differential signal.

Figure 3:
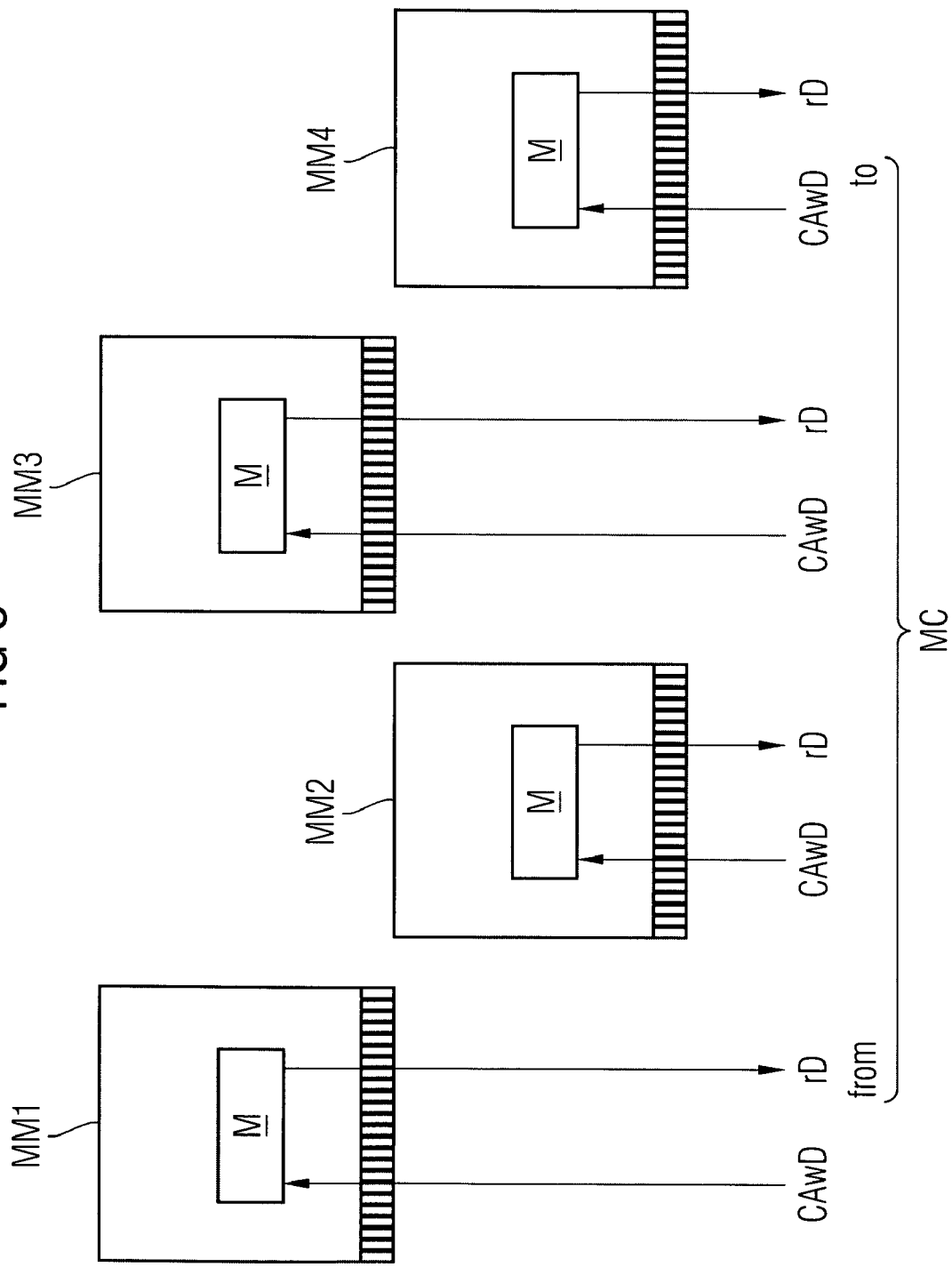
FIG. 3 illustrates a schematic diagram of four memory modules in accordance with yet another embodiment of the invention, showing each memory module having one memory chip.

FIG. 3 shows a block diagram of a semiconductor memory module in accordance with another embodiment of the invention, as well as a semiconductor memory system using the same. As shown, each of four memory modules MM1-M4 includes only one memory chip M and separate CAwD signal input lines CAwD each for separately transmitting write data, command, and address signals from a memory controller MC to one or more of the memory modules MM1-MM4 and further separate rD-signal output lines rD for transferring read data from one or more of the memory modules MM1-MM4 separately to the memory controller MC.

The above-disclosed embodiments of the present semiconductor memory modules (as depicted in FIGS. 1 to 3), as well as a semiconductor memory system using the same provides several advantages, including the flexible usage of the independent small memory modules and consoles that can use just two of these memory modules, utilizing e.g., the 16 bit bus. In addition, the embodiments provide servers capable of configuring their requirements on a per need basis and, as exemplified in FIG. 2, two memory modules useable for data storage and two memory modules useable for ECC storage for single error correction SEC, double error detection DED, or quad error correction QEC. Consequently, more complex error correction algorithms can be implemented when two memory modules are used for ECC. In addition to enabling flexible usage for different applications, the granularity of memories can be better adapted to fit various applications; therefore, consoles, network applications, set top boxes can utilize the same type of memory modules having for example DDR-DRAM memory chips.

While the invention has been described in detail and with reference to specific embodiments thereof, it will be apparent to one skilled in the art that various changes and command, and address input signals from an external memory controller MC (not shown) to the first M1 memory chip M1. On the substrate S, the CAwD signal input lines are arranged with a first predetermined line number n1 according to the number of the CAwD input signal pins P. By way of example the first predetermined line number may comprise a value of 8.

CAwD signal interconnection lines CAwDr on the substrate S interconnect the plurality of memory chips M1-M4. Specifically, the lines establish a connection between the first and second memory chips M1, M2; the second and third memory chips M2, M3; and the third and fourth memory chips M3, M4, supplying re-driven write data, command, and address signals from a preceding memory chip (for example M1) to one or more succeeding memory chip(s) (for example to M2 and/or to M3 and M4) in a first direction, namely, the direction of signal flow of the write data, command, and address signals.

To drive read data from the memory module MM to the memory controller MC, rD signal output lines rD are arranged on the substrate S with a second predetermined line number n2 connecting the last memory chip M4 to a connection pins P that send an rD output signals. Similar to the CAwD signal pins, the rD signal pins P may be equal to the second predetermined line number n2. By way of example, the second predetermined line number may comprise a value of 8. In addition, rD signal interconnection lines rD/rDr on the substrate S establish read data connections between the first and second memory chips M1, M2; the second and third memory chips M2, M3; and the third and fourth memory chips M3, M4, supplying read data signals from one or more preceding memory chips to the respectively succeeding memory chips in the first direction.

In this manner, a semiconductor memory module MM comprises a substrate S with four memory chips M1-M4 arranged thereon in a loop forward architecture is provided. That is, the memory chips and the signal lines are arranged. and connected in a loop forward architecture.

FIG. 2 illustrates a semiconductor memory module and system according to a second embodiment of the invention. As shown, each of four memory modules MM1, MM2, MM3, and MM4 differ from the memory module MM of FIG. 1 in several respects. First, only two memory chips, M1 and M2, are arranged in a loop forward architecture on a substrate S. Second, the first predetermined line number of the CAwD signal input lines CAwD and the CAwD signal interconnection lines are different. Third, modifications can be made therein without departing from the spirit and scope thereof. For example, while FIGS. 1 and 2 depict an arrangement of the memory chips and their connection with the CAwD signal input lines, CAwD signal interconnection lines, rD signal output lines, and rD signal interconnection lines in form of a loop forward topology, the arrangement of the memory chips, as well as the signal and data lines on the substrate may also form a star topology or a loop back topology and that the principles of the present invention can also be applied to the last mentioned different topologies. It is further to be mentioned that each of the CAwD signal input lines, the CAwD signal interconnection lines, the rD signal output lines, and the rD signal interconnection lines may comprise a differential signal line pair each for transmitting a differential signal.

Accordingly, it is intended that the present invention covers the modifications and variations of this invention provided they come within the scope of the appended claims and their equivalents.

What is claimed is:

1. A memory module comprising:
   a substrate;
   a plurality of memory chips arranged on the substrate in a specified topology;
   CAwD signal input lines arranged on the substrate in a first predetermined line number and connecting a first one of the memory chips to a first number of CAwD input signal pins on said substrate, said first number being equal to the first predetermined line number, wherein the signal input lines supply write data, command, and address input signals from an external memory controller to said first memory chip in a first direction;
   CAwD signal interconnection lines arranged on the substrate, the interconnection lines operable to establish re-driven write data, command, and address signal interconnections between the plurality of memory chips and to supply re-driven write data, command, and address signals from each preceding memory chip to each succeeding memory chip in the first direction;
   rD signal output lines arranged on the substrate in a second predetermined line number and connecting a last one of the plurality of memory chips different from the first memory chip to a second number of rD output signal pins on the substrate, the second number being equal to the predetermined second line number, wherein the rD output lines are configured to deliver read data output signals generated or re-driven by one or more of the plurality of memory chips to the memory controller; and
   rD signal interconnection lines arranged on the substrate, wherein the rD signal lines are operable to establish re-driven read data connections between the plurality of memory chips and to supply generated or re-driven read data signals from a preceding memory chip to a succeeding memory chip in the first direction;
   wherein the memory chips and the signal lines are arranged and connected in a loop-forward architecture, the first and further memory chips except the last memory chip have a re-drive function for the write data, command, and address signals, and the second and further memory chips except the first memory chip have a re-drive function for the read data signals.

2. The memory module of claim 1, wherein
   the plurality of memory chips comprises a first memory chip and a second memory chip; and
   the CAwD signal interconnection lines and the rD signal interconnection lines respectively establish interconnection between the first and second memory chips in the first direction to supply re-driven write data, command, and address signals and read data signals, respectively from the first to the second memory chip.

3. The memory module of claim 2, wherein the first predetermined line number value is 8 and the second predetermined line number value is 8.

4. The memory module of claim 1, wherein each of the CAwD signal input lines, the CAwD signal interconnection lines, the rD signal output lines, and the rD signal interconnection lines comprise a differential signal line pair adapted to transmit a differential signal.

5. The memory module of claim 1, wherein the memory chips comprise DDR-DRAM chips.

6. A memory system comprising:
   a memory controller; and a plurality of the memory modules wherein each memory module comprises:
  a substrate;
  a plurality of memory chips arranged on the substrate;
  CAwD signal input lines arranged on the substrate in a first predetermined line number and connecting a first one of the memory chips to a first number of CAwD input signal pins on said substrate, said first number being equal to the first predetermined line number, wherein the signal input lines supply write data, command, and address input signals from an external memory controller to said first memory chip in a first direction;
  CAwD signal interconnection lines arranged on the substrate, the interconnection lines operable to establish re-driven write data, command, and address signal interconnections between the plurality of memory chips and to supply re-driven write data, command, and address signals from each preceding memory chip to each succeeding memory chip in the first direction;
  rD signal output lines arranged on the substrate in a second predetermined line number and connecting a last one of the plurality of memory chips different from the first memory chip to a second number of rD output signal pins on the substrate, the second number being equal to the predetermined second line number, wherein the rD output lines are configured to deliver read data output signals generated or re-driven by one or more of the plurality of memory chips to the memory controller; and
  rD signal interconnection lines arranged on the substrate, wherein the rD signal lines are operable to establish re-driven read data connections between the plurality of memory chips and to supply generated or re-driven read data signals from a preceding memory chip to a succeeding memory chip in the first direction;
wherein each of the modules is separately connected to the memory controller in a point-to-point fashion by the CAwD signal input lines and the rD signal output lines, the memory chips and the signal lines of each module are arranged and connected in a loop-forward architecture, the first and further memory chips except the last memory chip of each module have a re-drive function for the write data, command, and address signals, the second and further memory chips except the first memory chip of each module have a re-drive function for the read data signals, and each of the modules is separately connected to the memory controller in a point-to-point fashion by the CAwD signal input lines and the rD signal output lines.

7. The memory system of claim 6, wherein:
the plurality of memory chips of each module comprises a first memory chip and a second memory chip; and
the CAwD signal interconnection lines and the rD signal interconnection lines of each module respectively establish interconnection between the first and second memory chips of each module in the first direction to supply re-driven write data, command, and address signals and read data signals, respectively from the first to the second memory chip of each module.

8. A memory system comprising:
a substrate;
a plurality of memory components arranged on the substrate in a specified topology;
  CAwD signal input lines arranged on the substrate in a first predetermined line number and connecting a first one of the memory components to a first number of CAwD input signal pins on said substrate, said first number being equal to the first predetermined line number, wherein the signal input lines supply write data, command, and address input signals from a memory controller to said first memory component in a first direction;
  CAwD signal interconnection lines arranged on the substrate, the interconnection lines operable to establish re-driven write data, command, and address signal interconnections between the plurality of memory components and to supply re-driven write data, command, and address signals from each preceding memory component to each succeeding memory component in the first direction;
  rD signal output lines arranged on the substrate in a second predetermined line number and connecting a last one of the plurality of memory components different from the first memory component to a second number of rD output signal pins on the substrate, the second number being equal to the predetermined second line number, wherein the rD output lines are configured to deliver read data output signals generated or re-driven by one or more of the plurality of memory components to the memory controller; and
  rD signal interconnection lines arranged on the substrate, wherein the rD signal lines are operable to establish re-driven read data connections between the plurality of memory components and to supply generated or re-driven read data signals from a preceding memory component to a succeeding memory component in the first direction;
  wherein the memory components and the signal lines are arranged and connected in a loop-forward architecture, the first and further memory components except the last memory component have a re-drive function for the write data, command, and address signals, and the second and further memory components except the first memory component have a re-drive function for the read data signals.

9. A method of operating a memory system, the memory system including a plurality of memory components arranged on a substrate and connected with each other in series, the method comprising:
  supplying data from a memory controller in a first direction to a first memory component in the series of memory components via CAwD signal input lines that connect the first memory component to CAwD input signal pins on the substrate, wherein the data supplied from the memory controller comprises at least one of write data, command data and address input signals;
  delivering re-driven data between the plurality of memory components using CAwD signal interconnection lines arranged on the substrate and connecting the memory components in series such that each preceding memory component supplies re-driven data to a succeeding memory component in the first direction via a corresponding CAwD signal interconnection line, wherein the re-driven data comprises at least one of re-driven write data, re-driven command data and re-driven address input signals;
  delivering read data output signals generated or re-driven by one or more of the plurality of memory components to the memory controller via rD signal output lines arranged on the substrate and connecting a last memory component in the series of memory components to rD output signal pins on the substrate; and supplying generated or re-driven read data signals in the first direction from preceding memory components to succeeding memory components in the series of memory components via rD signal interconnection lines arranged on the substrate;

wherein the memory components and the signal lines are arranged and connected in a loop-forward architecture, the first and further memory components except the last memory component in the series of memory components have a re-drive function for the re-driven data, and the second and further memory components except the first memory component in the series of memory components have a re-drive function for the read data signals.

* * * * *